(12) United States Patent
Ahn

(10) Patent No.: US 7,224,121 B2
(45) Date of Patent: May 29, 2007

(54) PLASMA DISPLAY DEVICE

(75) Inventor: Joong-Ha Ahn, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 11/118,342

(22) Filed: May 2, 2005

(65) Prior Publication Data
US 2005/0258749 A1 Nov. 24, 2005

(30) Foreign Application Priority Data
May 19, 2004 (KR) ...................... 10-2004-0035471

(51) Int. Cl.
*H01J 17/49* (2006.01)
(52) U.S. Cl. .................................... 313/582
(58) Field of Classification Search ................... 313/11, 313/581, 582
See application file for complete search history.

(56) References Cited

U.S. PATENT DOCUMENTS 5,971,566 A 10/1999 Tani et al.

*Primary Examiner*—Vip Patel
(74) *Attorney, Agent, or Firm*—Robert E. Bushnell, Esq.

(57) ABSTRACT

A plasma display device that enhances heat dissipation from a Plasma Display Panel (PDP) and additionally increases the efficiency in heat dissipation from driving circuit boards includes: a chassis base having a plate portion and a side portion; a Plasma Display Panel (PDP) adapted to be attached to a first side of the chassis base; and driving circuit boards adapted to be attached to the plate portion on a second side of the chassis base, the second side of the chassis base being opposite to the first side of the chassis base; wherein the side portion is bent toward the PDP on an edge of the plate portion and includes air vents; and wherein the side portion includes a flange consisting of a bent edge of the side portion, the flange adapted to be attached to an edge of the PDP.

9 Claims, 7 Drawing Sheets

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on 19 May 2004 and there duly assigned Ser. No. 10-2004-0035471.

BACKGROUND OF THE INVENTION

1. Field of the Invention

The present invention relates to a plasma display device and, in particular, to a plasma display device having a heat dissipation structure to induce a natural convection flow in the front and back sides of a Plasma Display Panel (PDP).

2. Description of the Related Art

It is well known that a plasma display device uses a plasma generated by gas discharge to produce an image on a Plasma Display Panel (PDP). The plasma display device comprises: a PDP; a chassis base having a first side to support the PDP; and driving circuit boards attached to a second side of the chassis base, the second side of the chassis base being opposite to the first side of the chassis base where the PDP is attached; wherein the driving circuit boards are electrically connected to sustain electrodes and address electrodes of the PDP via a flexible printed circuit and connectors.

Generally, the PDP is a weak component in terms of mechanical strength because its structure is made of two glass substrates. Therefore, a chassis base made of a metallic material is used to give additional mechanical strength to the PDP for maintaining the mechanical stability.

Besides the role of maintaining the mechanical strength of the PDP, the chassis base serves to fix the driving circuit boards, to dissipate heat from the PDP, and to ground the Electro Magnetic Interference (EMI) of the PDP.

The PDP is attached to a first side of the chassis base, and the driving circuit boards are attached to a second side of the chassis base, opposite to the first side of the chassis base. Instead of a screw connection, which has a difficulty in forming a screw hole on the glass substrate of the PDP, double-sided tape is used to attach the PDP to the first side of the chassis base. On the second side of the chassis base, bosses are formed where the driving boards are fixed by set screws.

U.S. Pat. No. 5,971,566 discusses a structure for attaching a PDP to the chassis base as described above. A heat conduction medium is inserted between the chassis base and the PDP. The chassis base dissipates the heat conducted from the PDP via the heat conduction medium and from the driving boards.

Such a plasma display device connects the PDP and the chassis base via double-sided tape, which blocks contact of the heat conduction medium with the air. As a result, the heat from the PDP is mainly dissipated by natural convection on the front side of the PDP and is partially conducted through the chassis base to the driving circuit boards. This prevents efficient heat dissipation from the PDP and the printed circuit boards.

SUMMARY OF THE INVENTION

In accordance with the present invention, a plasma display device is provided in which heat from the PDP and the driving circuit boards is dissipated efficiently.

In one exemplary embodiment, a plasma display device comprises: a chassis base having a plate portion and a side portion; a Plasma Display Panel (PDP) adapted to be attached to a first side of the chassis base; and driving circuit boards adapted to be attached to the plate portion on a second side of the chassis base, the second side of the chassis base being opposite to the first side of the chassis base; wherein the side portion is bent toward the PDP on an edge of the plate portion and includes air vents; and wherein the side portion includes a flange consisting of a bent edge of the side portion, the flange adapted to be attached to an edge of the PDP.

The plate portion preferably has a plurality of pressing rod apertures arranged at positions corresponding to the edge of the PDP.

At least one reinforcing member is preferably arranged between a central area of the plate portion and a corresponding central area of the PDP.

The reinforcing member is preferably arranged to extend vertically along a back side of the PDP.

Air vents are preferably arranged in top and side portions along the top and the bottom edges of the plate portion.

Air vents are alternatively preferably arranged in the top, bottom, left, and right side portions along the top, bottom, left, and right edges of the plate portion.

The flange is preferably bent parallel to the plate portion toward a center of the plate portion.

The flange is alternatively preferably bent parallel to the plate portion toward an outside of the plate portion.

An edge of the PDP is preferably attached to the flange with double-sided tape.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
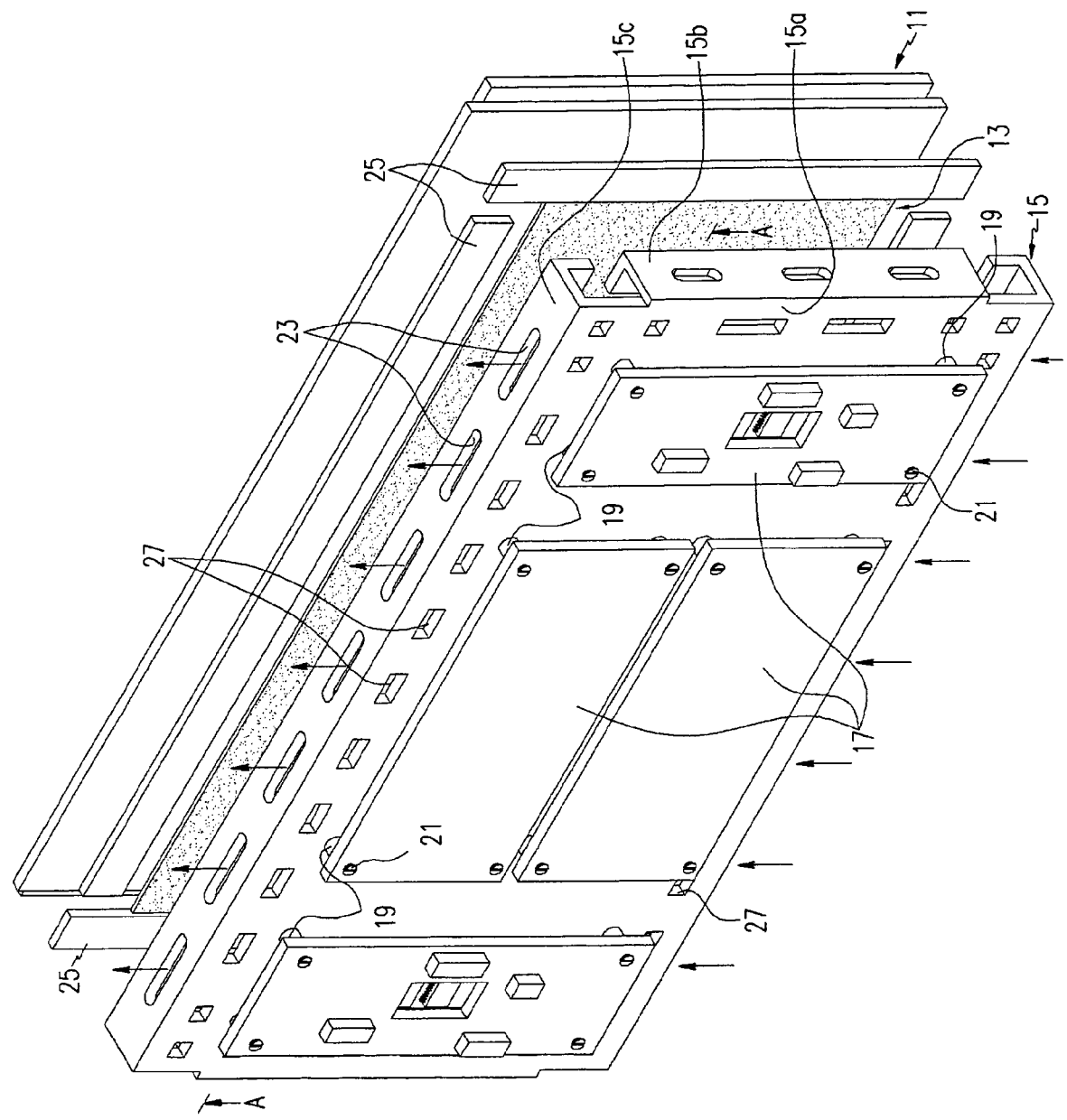
FIG. 1 is a perspective view of a disassembled plasma display device according to a first embodiment of the present invention.

As shown in the drawings, a plasma display device in accordance with a first embodiment of the present invention includes: a PDP 11 producing an image by a gas discharge; a heat conduction medium 13 attached to a back side of the PDP 11 and dissipating heat from the PDP 11 in the plane direction; a chassis base 15 supporting the PDP 11; and driving circuit boards 17 attached to the chassis base 15 and driving the PDP 11.

Since the PDP 11 is a plasma display panel that produces an image by a gas discharge, and the present invention relates to a structure for connecting the PDP with other components of the plasma display device, a detailed description of the PDP itself has been omitted.

The heat conduction medium 13 is attached to the back side of the PDP 11 to dissipate, by thermal conduction, heat generated from the PDP 11 during the gas discharge. The heat conduction medium 13 is a sheet structure as shown in FIG. 1.

The chassis base 15 supports the PDP 11 and is arranged on the back side of the PDP 11 and spaced away from the heat conduction medium 13 attached to the back side of the PDP 11. Thus, the chassis base 15 serves to support the PDP 11 so as to supplement the mechanical strength of the PDP 11 made of glass and to hold the driving circuit boards 17. It is preferable for the chassis base 15 to have an efficient structure for heat dissipation from the PDP 11.

The chassis base 15 is formed to have a structure for inducing natural convection between the chassis base 15 and the back side of the PDP 11, to be exact, the heat conduction medium 13. In particular, the natural convection flow is preferably in the vertical direction with respect to the chassis base 15 and the PDP 11. The chassis base 15 consists of a plate portion 15a, side portions 15b, and flanges 15c.

Figure 2:
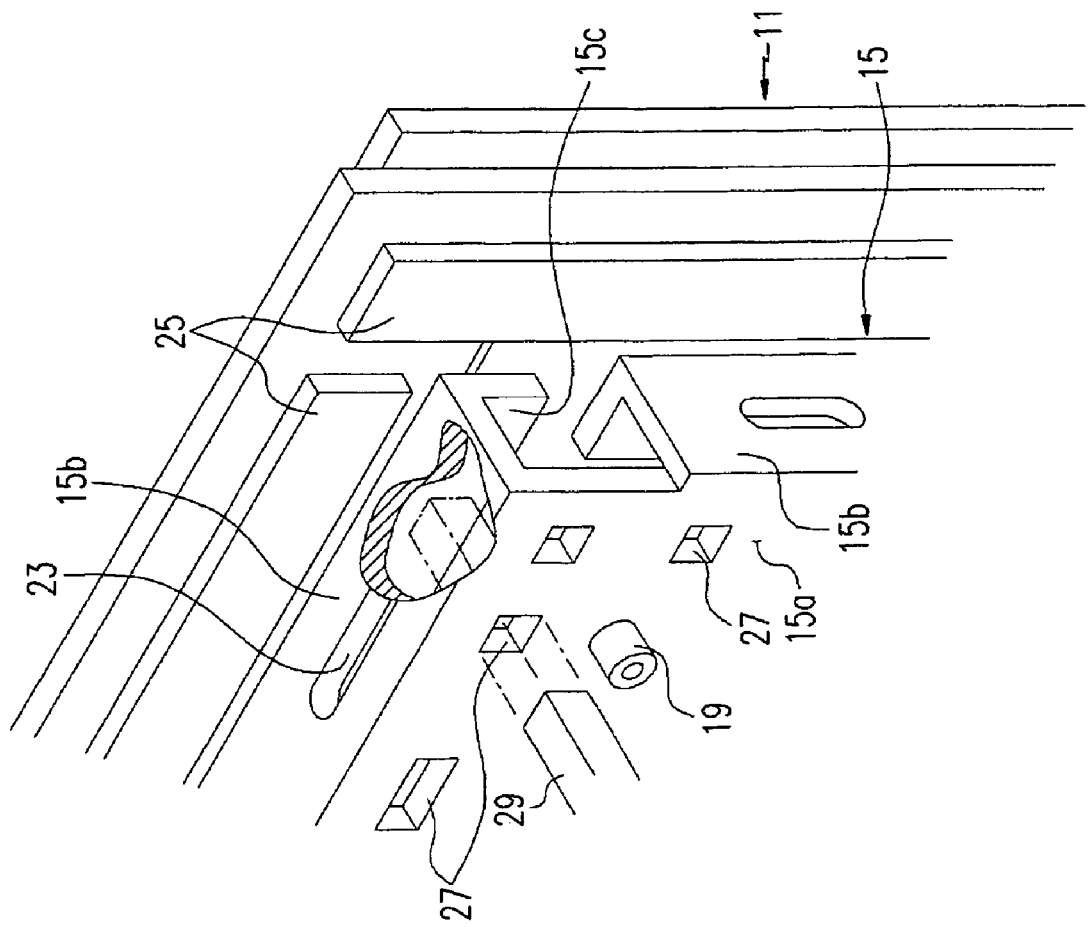
FIG. 2 is a partial perspective view of the process to attach the Plasma Display Panel (PDP) to the chassis base.
Figure 3:
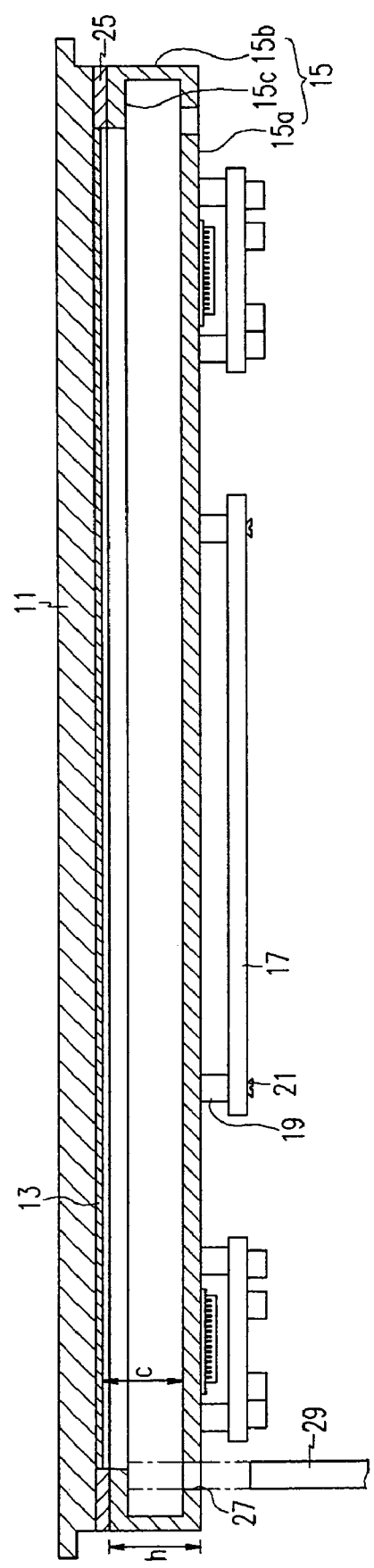
FIG. 3 is a side cross-sectional view of the assembled plasma display device of the first embodiment taken along line A—A of FIG. 1.

FIG. 2 is a partial perspective view of the process to attach the plasma display panel to the chassis base. FIG. 3 is a side cross-sectional view of the assembled plasma display device of the first embodiment taken along line A—A of FIG. 1.

As shown in the drawings, the plate portion 15a is a basis of the chassis base 15 and is preferably formed into a sheet structure where the driving circuit boards 17 can be mounted. However, the sheet structure may vary in shape, as long as the driving circuit boards 17 can be mounted. Natural convection flow is induced in the gap c between the back side of the PDP 11 and the plate portion 15a, and a plurality of slots (not shown) extending vertically are further provided in the plate portion 15a for efficient natural convection flow.

The side portion 15b separates the plate portion 15a by the gap c from the back side of the PDP 11 to enable the natural convection flow therebetween. The shape of the side portion 15b depends on the shape of the plate portion 15a, and generally, the side portions 15b are formed by bending all four edges of the plate portion 15a. The side portions 15b may be formed along only two edges of the plate portion 15a: the top and bottom edges, or the right and left edges of the plate portion 15a. Therefore, the side portion 15b is formed by bending the plate portion 15a toward the PDP 11 and determines the height of the natural convection flow by the height h of the bent portion. Since the depth of the plasma display device is proportional to the height h of the side portion 15b, it is preferable to minimize the height h of the side portion 15b while maintaining the natural convection flow. As a result, a relatively thin device can be obtained with enhanced heat dissipation from the PDP 11 by natural convection.

The side portion 15b has at least one air vent 23 and preferably a plurality of air vents 23. As shown in FIG. 1, the air vents 23 may be formed in the top and bottom side portions 15b only, or formed in the top, bottom, right, and left side portions 15b. In the case that the air vents 23 are formed in all of the top, bottom, right, and left side portions 15b, the natural convection is more effective than the case with the air vents 23 in the top and bottom side portions 15b only.

The natural convection induced between the PDP 11 and the chassis base 15 decreases the temperature of the PDP 11 effectively by dissipating the heat from the PDP 11 on the front side and the back side of the PDP 11. Additionally, the natural convection dissipates the heat effectively from the driving circuit boards 17 attached on the chassis base 15.

The flange 15c is formed by bending the edge of the side portions 15b and serves to facilitate the attachment of the chassis base 15 to the corresponding edges of the PDP 11. Therefore, the flange 15c may not be formed when the side portion 15b has a sufficient contact area at the end portion with the PDP 11 for strong attachment between the PDP 11 and the side portion 15b. In this case, the end portion of the side portion 15b, corresponding to the edge of the PDP 11, serves as the flange 15c.

The flange 15c is formed parallel to the plate portion 15a by bending the edge of the side portion 15b toward the center of the plate portion 15a. The flange 15c is preferably bent by a right angle from the side portion 15b when the side portion 15b is bent by a right angle from the plate portion 15a. The flange 15c is attached on the edge of the back side of the PDP 11 by means of double-sided tape 25 and provides sufficient contact area between the chassis base 15 and the PDP 11 for a strong attachment therebetween.

Near the edge of the plate portion 15a corresponding to the edge of the PDP 11, pressing rod holes are formed 27 that are for the secure attachment between the narrow flange 15c of the chassis base 15 and the edge of the back side of the PDP 11. In other words, the pressing rod holes 27 are formed at positions in the plate portion 15a corresponding to the flange 15c. The pressing rod 29 is inserted into the pressing rod holes 27 so as to push the flange 15c to the edge of the back side of the PDP 11 for firm contact therebetween. That increases the bonding strength of the double-sided tape 25 inserted between the flange 15c and the edge of the back side of the PDP 11. For that reason, it is preferable to form a plurality of pressing rod holes 27 along the edge of the plate portion 15a.

Figure 4:
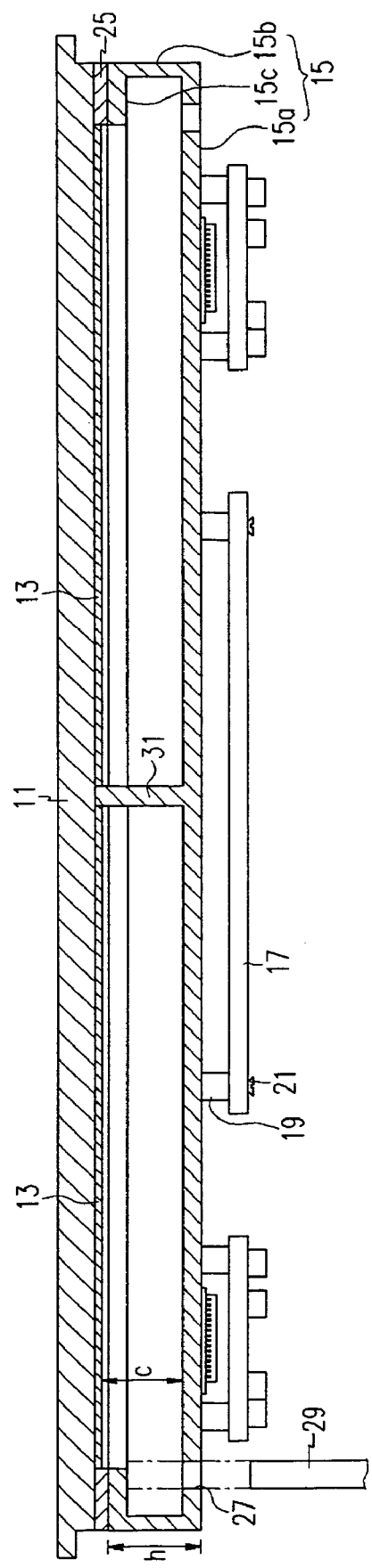
FIG. 4 is a side cross-sectional view of an assembled plasma display device of a second embodiment taken along line A—A of FIG. 1.

FIG. 4 is a side cross-sectional view of an assembled plasma display device of a second embodiment taken along line A—A of FIG. 1.

The plasma display device of the second embodiment, as shown in FIG. 4, has a same or similar overall structural composition to that of the first embodiment. Therefore, an explanation follows only for the differing components thereof.

In the second embodiment, a reinforcing member 31 is further provided in the plate portion 15a, which is the same as in the first embodiment. While the structural stability of the plate portion 15a of the first embodiment is provided with the side portions 15b only, the reinforcing member 31 gives additional structural support to both the central plate portion 15a and the central area of the PDP 11 that is spaced away from the plate portion 15a. Therefore, the plate portion 15a supports the PDP 11 more securely. It is preferable to form the reinforcing member 31 in the vertical direction. In a further exemplary embodiment, a plurality of reinforcing members 31 may be formed as long as the natural convection flow is not hindered.

Figure 5:
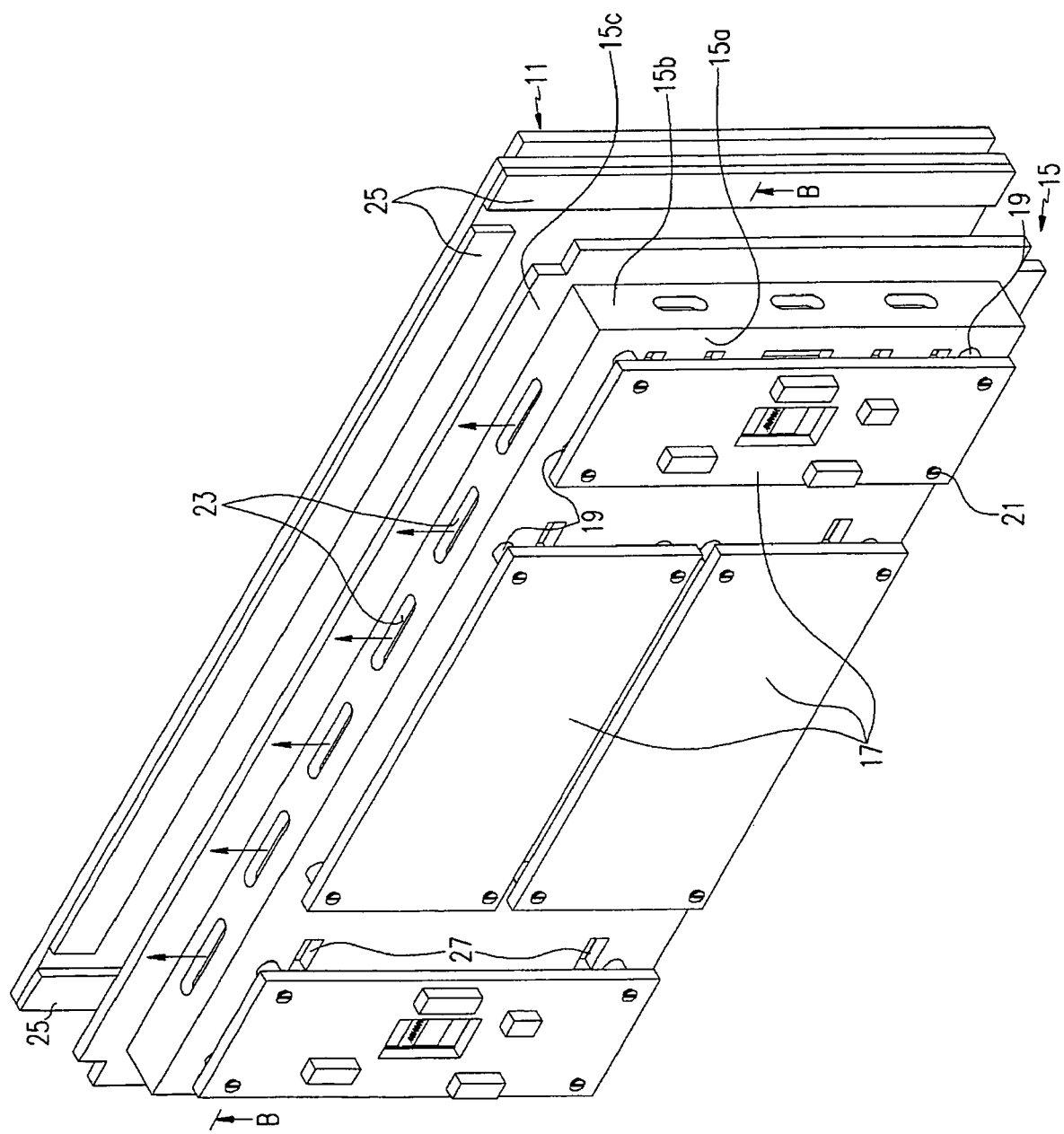
FIG. 5 is a schematic perspective view of a disassembled plasma display device according to a third embodiment of the present invention.
Figure 6:
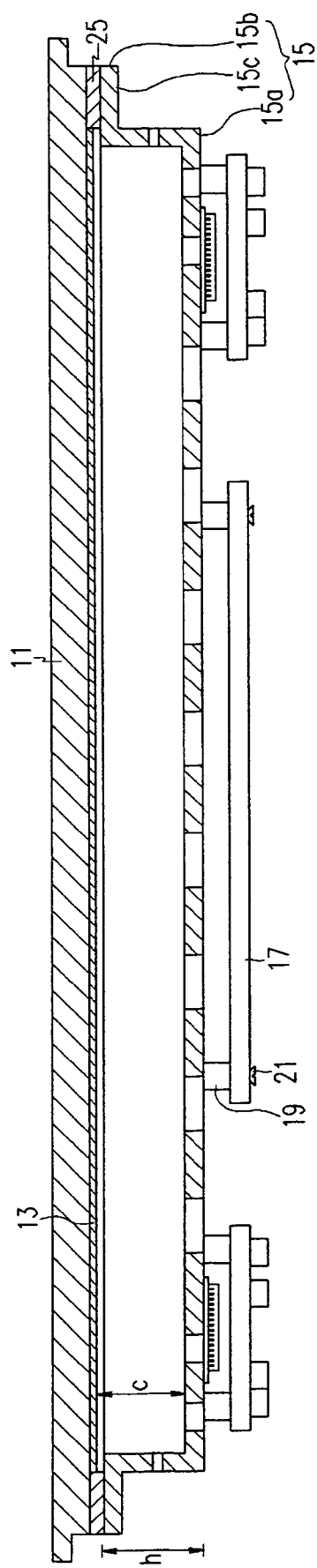
FIG. 6 is a side cross-sectional view of the assembled plasma display device of the third embodiment taken along line B—B of FIG. 5.

FIG. 5 is a perspective view of a disassembled plasma display device according to a third embodiment of the present invention. FIG. 6 is a side cross-sectional view of the assembled plasma display device of the third embodiment taken along line B—B of FIG. 5.

The plasma display device of the third embodiment, as shown in the drawings, has a same or similar overall structural composition to that of the first embodiment. Therefore, an explanation follows only for the differing components thereof.

In contrast to the first embodiment, the flange 15c of the third embodiment is formed parallel to the plate portion 15a by bending the edge of the side portion 15b toward the outside of the plate portion 15a.

Compared to the first embodiment, the same or similar bonding strength between the flange 15c and the PDP 11 is achievable without the pressing rod 29. Therefore, it is an advantage of the third embodiment that the pressing rod holes 27 are not necessary in the plate portion 15a.

Figure 7:
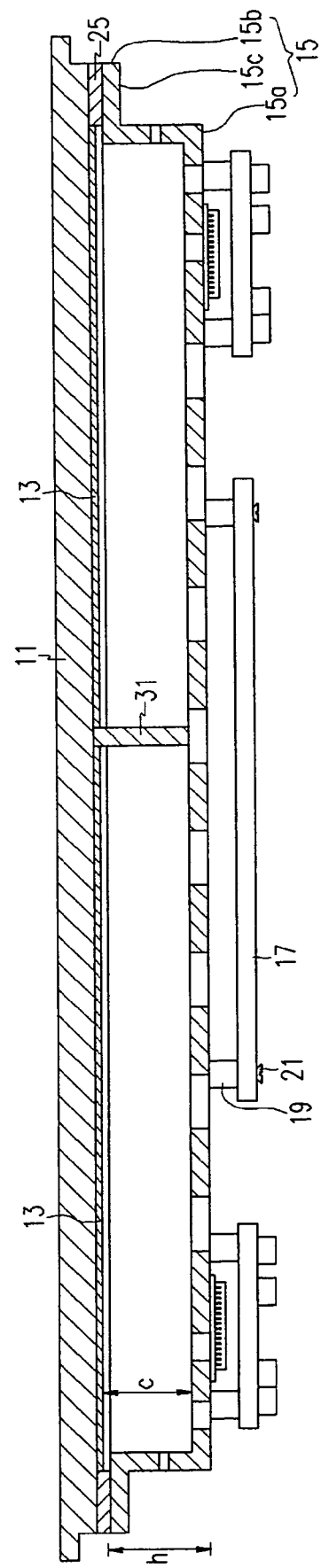
FIG. 7 is a side cross-sectional view of an assembled plasma display device of a fourth embodiment taken along line B—B of FIG. 5.

FIG. 7 is a side cross-sectional view of an assembled plasma display device of a fourth embodiment taken along line B—B of FIG. 5.

The plasma display device of the fourth embodiment, as shown in FIG. 7, has a same or similar overall structural composition to that of the third embodiment. Therefore, an explanation follows only for the differing components thereof.

In the fourth embodiment, the plate portion 15a has an additional reinforcing member 31 that is the same as that of the second embodiment. The reinforcing member 31 gives additional structural support to both the central plate portion 15a and the central area of the PDP 11 so that the plate portion 15a supports the PDP 11 more securely. As in the second embodiment, the reinforcing member 31 is preferably formed in the vertical direction, and a plurality of reinforcing members 31 may be formed.

Although exemplary embodiments of the present invention have been described in detail hereinabove, it should be understood that many variations and/or modifications of the basic inventive concept taught therein will still fall within the spirit and scope of the present invention, as defined in the appended claims.

In accordance with the plasma display device of the present invention, the chassis base includes the plate portion, the side portions, and the flanges to provide the air vents in the side portions and to separate the chassis base from the back side of the PDP for inducing the natural convection along the back side of the PDP. As a result, the heat dissipation from the PDP is enhanced by the natural convection on both sides of the PDP. Furthermore, efficient heat dissipation from the driving circuit boards is obtained by blocking effectively the heat conduction from the PDP though the chassis base to the driving boards.

What is claimed is:

1. A plasma display device comprising:
   a chassis base having a plate portion and a side portion;
   a Plasma Display Panel (PDP) adapted to be attached to a first side of the chassis base; and
   driving circuit boards adapted to be attached to the plate portion on a second side of the chassis base, the second side of the chassis base being opposite to the first side of the chassis base;
   wherein the side portion is bent toward the PDP on an edge of the plate portion and includes air vents; and
   wherein the side portion includes a flange consisting of a bent edge of the side portion, the flange adapted to be attached to an edge of the PDP.

2. The plasma display device of claim 1, wherein the plate portion has a plurality of pressing rod apertures arranged at positions corresponding to the edge of the PDP.

3. The plasma display device of claim 1, wherein at least one reinforcing member is arranged between a central area of the plate portion and a corresponding central area of the PDP.

4. The plasma display device of claim 3, wherein the reinforcing member is arranged to extend vertically along a back side of the PDP.

5. The plasma display device of claim 1, wherein air vents are arranged in top and side portions along the top and the bottom edges of the plate portion.

6. The plasma display device of claim 1, wherein air vents are arranged in the top, bottom, left, and right side portions along the top, bottom, left, and right edges of the plate portion.

7. The plasma display device of claim 1, wherein the flange is bent parallel to the plate portion toward a center of the plate portion.

8. The plasma display device of claim 1, wherein the flange is bent parallel to the plate portion toward an outside of the plate portion.

9. The plasma display device of claim 1, wherein an edge of the PDP is attached to the flange with double-sided tape.

* * * * *